United States Patent [19]

Miersch et al.

[11] 4,103,342
[45] Jul. 25, 1978

[54] TWO-DEVICE MEMORY CELL WITH SINGLE FLOATING CAPACITOR

[75] Inventors: Ekkehard Fritz Miersch, Mahopac; Dominic Patrick Spampinato, Ozone Park, both of N.Y.

[73] Assignee: International Business Machines Corporation, Armonk, N.Y.

[21] Appl. No.: 697,188

[22] Filed: Jun. 17, 1976

[51] Int. Cl.² .................. G11C 11/24; G11C 11/40; G11C 7/02
[52] U.S. Cl. .................................. 365/149; 365/208
[58] Field of Search ................. 340/173 CA; 361/328, 361/330; 365/149, 187, 174, 208

[56] References Cited

U.S. PATENT DOCUMENTS

| 3,463,992 | 8/1969 | Solberg | 361/328 X |
| 3,585,185 | 12/1974 | Reed | 340/173 DR |
| 3,938,109 | 2/1976 | Gionis et al. | 340/173 R |

*Primary Examiner*—Bernard Konick
*Assistant Examiner*—Donald McElheny
*Attorney, Agent, or Firm*—John A. Jordan; John J. Goodwin

[57] ABSTRACT

A two-device memory cell for a memory array comprising a single storage capacitor having its terminals respectively coupled to one end of the respective source-drain paths of a pair of field-effect transistors so as to be in series therewith and float between a pair of bit/sense lines of the memory array respectively coupled to the other end of said paths and thereby provide a differential sense signal. Each of the gate electrodes of said pair of field effect transistors is coupled to the word line of said memory array. The differential sense signal obtained from such an arrangement obviates the need for a dummy cell to provide a reference level for detecting the state of the cell.

9 Claims, 3 Drawing Figures

TWO-DEVICE MEMORY CELL WITH SINGLE FLOATING CAPACITOR

BACKGROUND OF THE INVENTION

1. Field of the Invention

The present invention relates to capacitive memory cells for the storage of binary information. More particularly, the subject disclosure relates to two-device memory cells using a single storage capacitor which cells may be utilized in memory arrays such as those typically employed in integrated circuit memory arrays.

2. Description of the Prior Art

One of the difficulties with the one-device cell, such as the one-device cell described in U.S. Pat. No. 3,387,286 resides in the fact that such a cell uses a common storage electrode (usually polysilicon) which covers a large area of the chip, most of which area is over a thin oxide. As a result of such a structural arrangement, any pin hole defect in the oxide will readily cause a short between the common storage electrode or plate and the other electrode of the storage capacitor of such a cell. The probability of a defect is relatively high considering the rather large area involved. As is evident, such a short will have serious consequences, thereby lowering yield.

A further difficulty with the one-device cell resides in the fact that when a word line is interrogated, the resulting AC current flow in the highly resistive storage electrode plate will cause a potential bounce. Such a potential bounce may have a deleterious effect on neighboring cells. In addition, the single-device memory cell suffers from susceptibility to noise, restrictive tolerance requirements, leakage current, and the like.

Two-device memory cells obviating some of the difficulties of the one-device cell have heretofore been known in the art. For example, Barsuhn et al describe a two-device memory cell arrangement in IBM Technical Disclosure Bulletin, Vol. 18, No. 3, August 1975 at pp. 786 and 787. One advantage to the two-device memory cell resides in the fact that it exhibits a high degree of symmetry thereby providing differential sensing, excellent common mode noise rejection and relatively liberal tolerance requirements.

Although the two-device cell does overcome some of the disadvantages to the single-device cell, the two-device cell still exhibits shortcomings in its performance. For example, the two-device cell utilizes two capacitors having a common connection referenced to ground. As a result, each capacitor has its own charging/discharging path whereby differences between these two paths, such as differences in leakage current, are not compensated for. A further disadvantage to the two-device cell utilizing two capacitors resides in the fact that it exhibits a relatively low sense signal.

SUMMARY OF THE INVENTION

In accordance with the principles of the present invention, an improved and simplified two-device memory cell using a single storage capacitor is provided. By providing a single storage capacitor, interposed between the two devices of the memory cell, operation is achieved which yields a relatively large sense signal, compensation for leakage current, elimination of potential bounce and high common mode noise rejection.

It is, therefore, an object of the present invention to provide an improved memory cell.

It is a further object of the present invention to provide a simplified and improved two-device memory cell.

It is yet a further object of the present invention to provide a two-device memory cell which offers a relatively large sense signal.

It is yet still a further object of the present invention to provide a two-device memory cell which compensates for leakage current.

It is another object of the present invention to provide an improved memory cell which is simplified in design and which exhibits a high degree of common mode noise rejection, is relatively insensitive to tolerances and exhibits a minimal effect on neighboring cells through such effects as potential bounce, shorting, and the like.

The foregoing and other objects, features and advantages of the invention will be apparent from the following more particular description of the preferred embodiment of the invention as illustrated in the accompanying drawings.

DETAILED DESCRIPTION OF THE DRAWING

Figure 1:
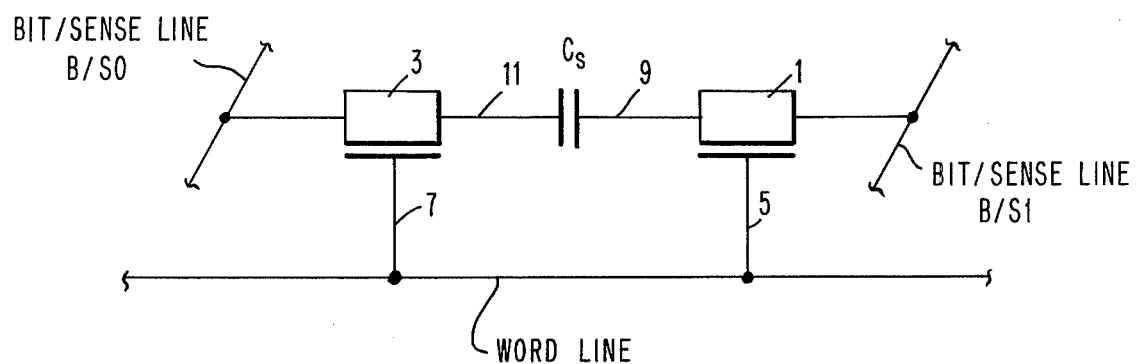
FIG. 1 shows the two-device memory cell utilizing a single capacitor, in accordance with the principles of the present invention.

With regard to FIG. 1, there is shown a schematic of the two-device memory cell utilizing a single storage capacitor, in accordance with the principles of the present invention. As shown, capacitor $C_s$ is interposed between FET switching devices 1 and 3. As can be seen, respective gate electrodes 5 and 7 are connected to the word line, as shown. The souce-drain path of FET 1 is coupled between one side of capacitor $C_s$ and bit/sense line B/S1. Similarly, the source-drain path of FET 3 is coupled between the other side of capacitor $C_s$ and bit/sense line B/S0. As is understood by those skilled in the art, although the switching devices shown in FIG. 1 are represented as FETs, any of a variety of switching devices may readily be employed for switches 1 and 3.

Figure 2:
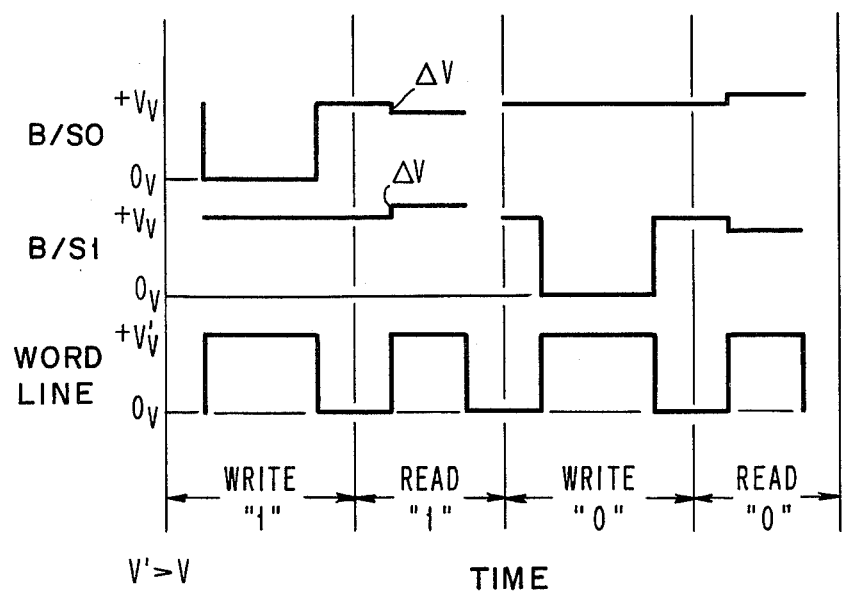
FIG. 2 shows a series of concurrent voltage wave forms used to describe the operation of FIG. 1.

The operation of the two-device memory cell with single storage capacitor, as shown in FIG. 1, may more easily be understood by reference to the concurrent voltage wave forms shown in FIG. 2. The waveforms of FIG. 2 assume the use of N-channel, enhancement mode devices. To write a given binary state, the word line, as represented by the third wave form in FIG. 2, is activated. In addition, one bit/sense line is clamped or held to a high potential while the other is clamped or held to a low potential. The opposite state is written by introducing complementary voltage potentials, i.e., holding the one bit/sense line to a low potential while the other is held to a high potential. Accordingly, to write a binary "1", the B/S1 line is clamped to $Vv$ (high level) and the B/S0 line is clamped to $Ov$ (low level) with the word line activated. This condition is shown during the first time frame of FIG. 2. Alternatively to write a binary "0", the operation is reversed, i.e., the B/S1 line is clamped to $Ov$ and the B/S0 line is clamped to $+Vv$, with the word line activated. This latter condition is shown in the third time frame of FIG. 2.

To read the binary condition of the memory cell, the parasitic capacitance $C_{bs}$ of the B/S0 and B/S1 lines are precharged to $+Vv$ and then isolated. The word line is then activated. The differential sense signal developed across the bit/sense lines B/SO and B/S1 is given by $|\Delta V| = (2|V_{s1} - V_{s2}|)/(2 + C_{bs}/C_s)$ where $V_{s1}$ and $V_{s2}$ represent the respective stored voltage levels at nodes 9 and 11 in FIG. 1. Thus, with the cell arrangement of FIG. 1, in accordance with the present invention, a differential sense signal is developed across $C_s$ between sense lines B/SO and B/S1 which is actually larger than those normally obtained from the one-device cell, or the two-device cell with two storage capacitors. For example, the storage cell in accordance with the present invention provides a sense signal which is effectively four times the sense signal of the one-device cell for a given $C_{bs}/C_s$ ratio and two times the sense signal of the dual capacitor two-device cell for a given $C_{bs}/C_s$ ratio.

In this regard, in the one-device cell, the reference level used to detect the binary state of the cell is put at the midpoint of the signal $\Delta V$ thereby making the sense signal $\frac{1}{2}\Delta V$. In the dual capacitor two-device cell, the sense signal is $\Delta V$ while in the differential single capacitor two-device cell of the present invention, the sense signal is $2\Delta V$. This is shown in FIG. 2.

As can be seen with reference to FIG. 1, storage capacitor $C_s$ is arranged between FET switching devices 1 and 3 in a manner to "float" therebetween. The differential sense signal obtained from such an arrangement obviates the need for any dummy cells to establish a reference level for state detection, as is the case in one-device cells. The floating nature of capacitor $C_s$ acts to minimize the effect of any remnant charge left in the cell device channel, since an almost equal amount of charge is trapped in each half of the cell. Stated another way, both FET device channels on opposite sides of the capacitor trap the same amount of charge when the memory cell is interrogated. Typically, in one-device memory cells, the charge remaining in the device channel subtracts from the sense signal resulting in a significantly smaller signal being sensed.

Figure 3:
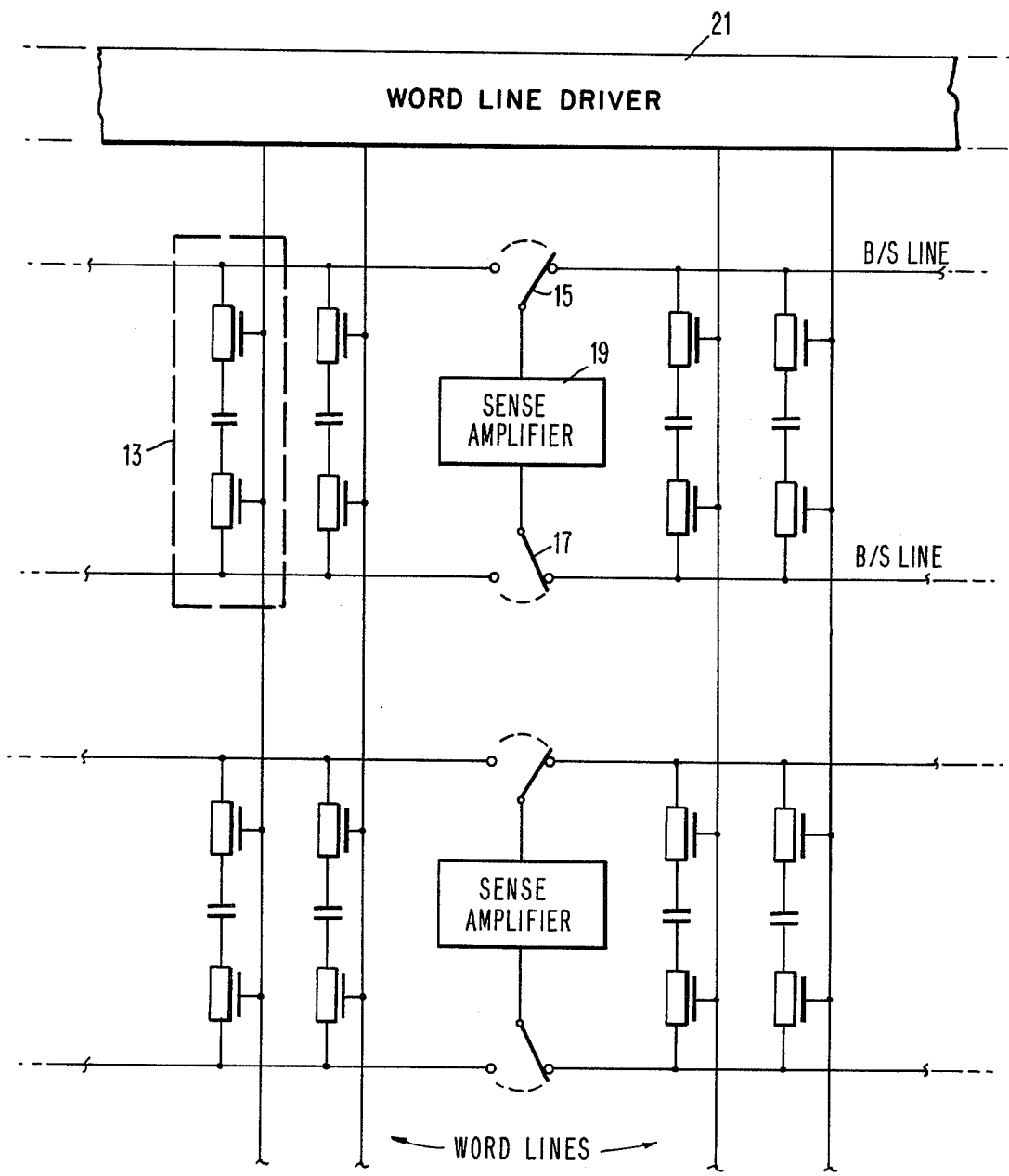
FIG. 3 shows the two-device memory cell of FIG. 1 in a memory array.

FIG. 3 shows the memory cell of FIG. 1, as depicted for example by cell 13, in a memory array. Although any of a variety of switching means may be used to interrogate the bit/sense lines of the array, for purposes of explanation such switching means have been shown in FIG. 3 as mechanical switches, as depicted by switches 15 and 17 for example. When switches 15 and 17, for example, are operated along with a word line signal from word line source 21 to "read" cell 13, the differential sense signal $2\Delta V$ is applied via switches 15 and 17 to the differential input lines of sense amplifier 19. Typically, sense amplifier 19 may be a differential amplifier of the type familiar to those skilled in the art.

An additional important feature of the two-device single storage capacitor memory cell configuration shown in FIG. 1 is that the cell arrangement acts to compensate, to a degree, for leakage. In this regard, this can be seen if we assume node 9 is charged to, for example, $+V$ volts and node 11 is at 0 volts. Assume further that the potential at node 9 begins to fall due to leakage current. Then, the potential at node 11 will, in turn, follow the potential drop at node 9. As a result, the potential across storage capacitor $C_s$ remains essentially constant and, as can be seen from the above equation, so does the sense signal.

However, due to the electrical properties of the devices, a point will be reached where leakage compensation is no longer possible. At this point the information in the cell must be refreshed, i.e., the data must be read out and the full data levels restored in the cell. The cell then is a.c. stable and appears d.c. stable as a result of periodically refreshing the data.

As hereinabove mentioned, it can also be seen that because of the high degree of symmetry of the two-device single capacitor memory cell as shown in FIG. 1, high common mode noise rejection is obtained. In addition, the configuration permits a high degree of tolerance insofar as circuit device parameters are concerned.

It is clear that any of a variety of techniques may be utilized to simply and conveniently fabricate the memory cell of FIG. 1 and memory array of FIG. 3. For example, it is possible to fabricate this cell using a conventional recessed oxide (ROX) process with one additional masking step to form the polysilicon to diffusion contact required for the storage capacitor. Typical of the techniques that may be used to fabricate the memory cell are those described, for example, by Donofrio in U.S. Pat. No. 3,706,891. However, it should be understood that the particular manner chosen to fabricate an array of the memory cell shown in FIG. 1 is a matter of design choice, not a part of the present invention.

While the invention has been particularly shown and described with reference to preferred embodiment thereof, it will be understood by those skilled in the art that various changes in form and details may be made therein without departing from the spirit and scope of the invention.

What is claimed is:

1. A two-device memory cell for a memory array, comprising:
   a pair of field-effect transistor devices each having a source, drain and gate electrode with the said source and drain electrode of respective ones of said field-effect transistor devices forming a series path the conduction of which is controlled by the gate electrode of respective ones of said devices, said devices being arranged so that one end of each of the respective source-drain paths is adapted to be connected to respective bit/sense line means for said memory array and so that each of the gate electrodes of said devices is adapted to be coupled to word line means for said memory array; and
   a single capacitor directly connected between the other ends of the respective source-drain paths of said field-effect transistor devices so as to float between said respective bit/sense line means in series with each of the respective source-drain paths to thereby provide a differential sense signal.

2. The two-device memory cell as set forth in claim 1 wherein the same one of the said electrodes of said respective source-drain paths is connected to said single capacitor.

3. In a memory array including a plurality of memory cells each coupled to at least one of a plurality of word lines for said memory array and at least one of a plurality of bit/sense lines for said memory array, each said cell comprising;
   a pair of field-effect transistor means each having a source, drain and gate electrode with the said source and drain electrode of respective ones of said field-effect transistor means forming a series path the conduction of which is controlled by the gate electrode of respective ones of said transistor means, said transistor means being arranged so that one end of each of the respective source-drain paths is adapted to be connected to respective ones of said plurality of bit/sense lines for said memory array and so that each of the gate electrodes of said transistor means is adapted to be coupled to at least one of said plurality of word lines for said memory array; and a single capacitor directly connected between the other ends of the respective source-drain paths of said field-effect transistor means so as to float between said respective bit/sense lines in series with each of the respective source-drain paths to thereby provide a differential sense signal.

4. The memory cell as set forth in claim 3 wherein the same one of the said electrodes of said respective source-drain paths is connected to said single capacitor.

5. In the memory array as set forth in claim 3, said cells formed in integrated circuit form.

6. A process for writing and reading bit information in a memory array having bit/sense lines and word lines, comprising:

writing said bit information in a single capacitor coupled between respective ones of a pair of said bit/sense lines by holding the potential on one of said pair of bit/sense lines at one potential and holding the potential on the other of said pair of bit/sense lines at another potential until said single capacitor is charged;

isolating said single capacitor as charged by forming substantially an open circuit on each side of said single capacitor in response to voltage on at least one of said word lines; and reading said bit information by forming substantially a closed circuit on each side of said single capacitor in response to voltage on at least one of said word lines so as to develop a differential sense from said storage device.

7. The process as set forth in claim 6 wherein the step of reading comprises first precharging the parasitic capacitance of each of said pair of bit/sense lines to the larger of said one or another potentials and then forming said substantially closed circuits on each side of said single capacitor to develop said differential sense signal across said pair of bit/sense lines.

8. The process as set forth in claim 7 wherein the step of holding the potential on the said one and other of said pair of bit/sense lines comprises holding said potential until said single capacitor is charged to the difference in said potentials.

9. The process as set forth in claim 8 wherein said step of writing is periodically repeated to renew the charge on said single capacitor.

* * * * *